(12) United States Patent
Takata et al.

(10) Patent No.: US 7,619,491 B2
(45) Date of Patent: Nov. 17, 2009

(54) ELASTIC WAVE DUPLEXER

(75) Inventors: Toshiaki Takata, Ishikawa-gun (JP); Osamu Yokokura, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/274,411

(22) Filed: Nov. 20, 2008

(65) Prior Publication Data

US 2009/0058555 A1    Mar. 5, 2009

Related U.S. Application Data

(63) Continuation of application No. PCT/JP2007/060189, filed on May 18, 2007.

(30) Foreign Application Priority Data

Jun. 12, 2006   (JP)   ............... 2006-162895

(51) Int. Cl.
    *H03H 9/72*   (2006.01)
    *H03H 9/64*   (2006.01)
(52) U.S. Cl. .................... 333/133; 333/193
(58) Field of Classification Search ............... 333/133, 333/193–196
See application file for complete search history.

(56) References Cited

U.S. PATENT DOCUMENTS

| 5,554,960 | A |   | 9/1996 | Ohnuki et al. |
|---|---|---|---|---|
| 6,380,823 | B1 |   | 4/2002 | Ikata et al. |
| 6,756,864 | B2 | * | 6/2004 | Muramatsu ............ 333/133 |
| 6,781,479 | B2 | * | 8/2004 | Ikada et al. ............ 333/133 |
| 6,982,612 | B2 | * | 1/2006 | Sakano .................. 333/133 |
| 7,053,731 | B2 |   | 5/2006 | Iwamoto et al. |
| 2004/0119562 | A1 |   | 6/2004 | Sakano |
| 2004/0155730 | A1 |   | 8/2004 | Iwamoto et al. |
| 2005/0237130 | A1 |   | 10/2005 | Iwamoto et al. |
| 2006/0192633 | A1 |   | 8/2006 | Kishimoto et al. |

FOREIGN PATENT DOCUMENTS

| JP | 06-097761 A | 4/1994 |
|---|---|---|
| JP | 08-191230 A | 7/1996 |
| JP | 2004-080233 A | 3/2004 |
| JP | 2005-079884 A | 3/2005 |

OTHER PUBLICATIONS

Official Communication issued in International Patent Application No. PCT/JP2007/060189, mailed on Aug. 28, 2007.

* cited by examiner

*Primary Examiner*—Barbara Summons
(74) *Attorney, Agent, or Firm*—Keating & Bennett, LLP (57) ABSTRACT

An elastic wave duplexer includes a transmission filter chip and a reception filter chip each defined by an elastic wave filter chip and flip-chip bonded to a laminated board. A coil-shaped line including coil-shaped line patterns is provided inside the laminated board. The coil-shaped line defines an impedance matching circuit. In plan view, the transmission filter chip is disposed on one side of a center line passing through the approximate center of the laminated board and extending between a first edge and a second edge, and the reception filter chip is disposed on the other side of the center line. The coil-shaped line is disposed on the side on which the reception filter chip is disposed.

7 Claims, 9 Drawing Sheets

ELASTIC WAVE DUPLEXER

BACKGROUND OF THE INVENTION

1. Field of the Invention

The present invention relates to an elastic wave duplexer including an elastic wave filter, such as a surface acoustic wave filter or a boundary elastic wave filter, and, in particular, to an elastic wave duplexer having including a transmission filter chip and a reception filter chip that are flip-chip bonded to a laminated board using a face-down technique.

2. Description of the Related Art

For mobile communication devices, such as cell phones, in order to reduce the size, the demand for a composite electronic component including a plurality of electronic components integrated therein is increasing. To meet such a demand, a duplexer including a transmission filter and a reception filter integrated therein has been commonly used. The transmission filter and the reception filter are connected to an antenna terminal. In addition, to reduce the size of the filters, surface acoustic wave filters using surface acoustic waves have been used for the reception filter and the transmission filter.

Japanese Unexamined Patent Application Publication No. 2003-249842 describes an example of a duplexer including such a surface acoustic wave filter.

Figure 9:
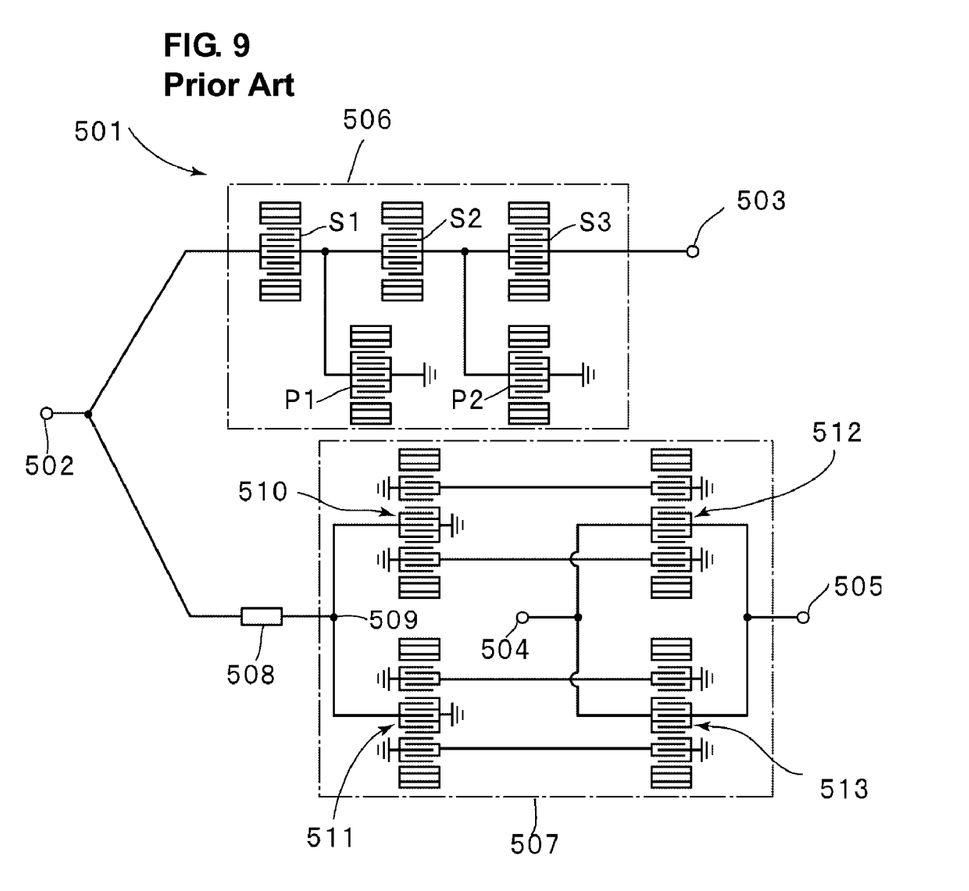
FIG. 9 illustrates the circuit configuration of a known elastic wave duplexer.

FIG. 9 is a plan view schematically illustrating the circuit configuration of the surface acoustic wave duplexer described in Japanese Unexamined Patent Application Publication No. 2003-249842. A surface acoustic wave duplexer 501 includes an antenna terminal 502 connected to an antenna, a transmission terminal 503, a first reception terminal 504, and a second reception terminal 505. The reception terminals 504 and 505 are balanced output terminals. The reception terminals 504 and 505 of the surface acoustic wave duplexer 501 can provide a balanced output.

One end of a transmission filter 506 and one end of a reception filter 507 are connected to the antenna terminal 502. That is, the transmission filter 506 and the reception filter 507 are commonly connected to each other and are connected to the antenna terminal 502. A matching circuit 508 is connected between the antenna terminal 502 and the reception filter 507. The transmission filter 506 is a surface acoustic wave filter having a ladder type circuit configuration. The circuit configuration includes a plurality of series-arm resonators S1, S2, and S3 and a plurality of parallel-arm resonators P1 and P2.

The reception filter 507 includes an input end 509 connected to the antenna terminal 502 via the matching circuit 508. One end of a first longitudinally coupled resonator type surface acoustic wave filter unit 510 and one end of a second longitudinally coupled resonator type surface acoustic wave filter unit 511 are connected to the input end 509. A third longitudinally coupled resonator type surface acoustic wave filter unit 512 and a fourth longitudinally coupled resonator type surface acoustic wave filter unit 513 are connected downstream of the first longitudinally coupled resonator type surface acoustic wave filter unit 510 and the second longitudinally coupled resonator type surface acoustic wave filter unit 511, respectively. The first to fourth longitudinally coupled resonator type surface acoustic wave filter units 510 to 513 are 3-IDT longitudinally coupled resonator type surface acoustic wave filter devices. One end of an IDT located in the middle of the third longitudinally coupled resonator type surface acoustic wave filter unit 512 is connected to one end of an IDT located in the middle of the fourth longitudinally coupled resonator type surface acoustic wave filter unit 513 and is connected to the first reception terminal 504. The other ends of the middle IDTs are commonly connected to each other and are connected to the second reception terminal 505.

The first to fourth longitudinally coupled resonator type surface acoustic wave filter units 510 to 513 are configured so that the phase of a signal flowing from the input end 509 to the first reception terminal 504 is inverted with respect to the phase of a signal flowing from the input end 509 to the second reception terminal 505.

In order to produce the surface acoustic wave duplexer 501 having such a circuit configuration, surface acoustic wave filter chips that define the transmission filter 506 and the reception filter 507 are mounted on a laminated board and are connected to an electrode pattern disposed on the laminated board using bonding wires.

In addition, a phase matching pattern defining the matching circuit 508 is provided at a certain height in the laminated board. More specifically, as shown by a schematic plan sectional view shown in FIG. 10, a meandering phase matching circuit pattern 521 is provided at an intermediate height in a laminated board 520. One end of the phase matching circuit pattern 521 is connected to an input end of a reception filter disposed on the laminated board 520. The other end is connected to the antenna terminal.

Figure 11:
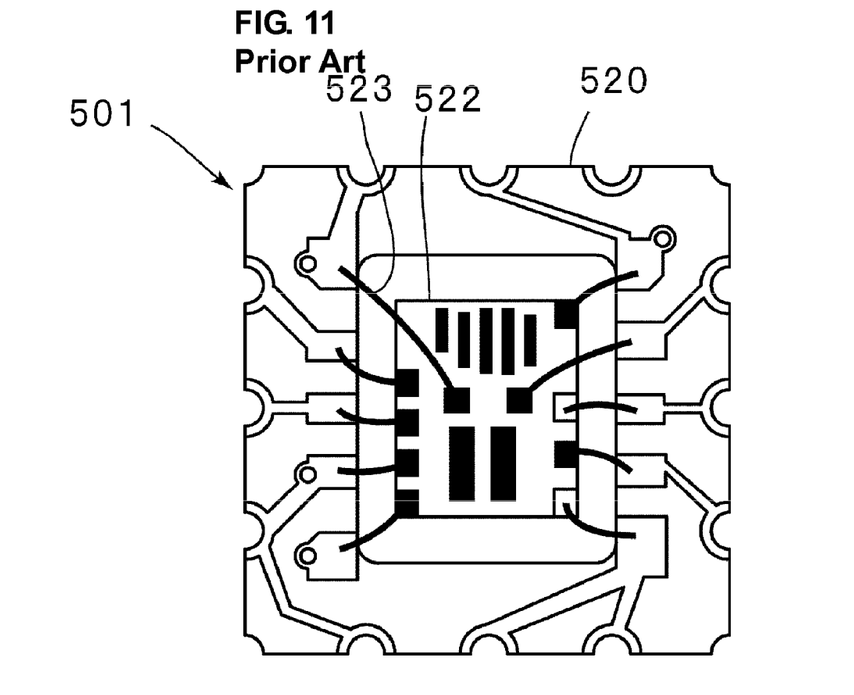
FIG. 11 is a schematic plan view illustrating a surface acoustic wave filter chip mounted on a laminated board of the known elastic wave duplexer.

FIG. 11 is a schematic plan view illustrating a surface acoustic wave filter chip mounted on a top surface of the laminated board illustrated in an embodiment described in Japanese Unexamined Patent Application Publication No. 2003-249842. As shown in FIG. 11, a surface acoustic wave filter chip 522 that defines a transmission filter and a reception filter is mounted on the laminated board 520. The surface acoustic wave filter chip 522 is electrically connected to an electrode land provided on the laminated board 520 by, for example, a bonding wire 523.

Recently, to reduce the size of a surface acoustic wave duplexer, a surface acoustic wave filter chip is flip-chip bonded onto a laminated board using a bump. Since a bonding wire is not used, a bonding operation can be efficiently performed. In addition, the size of the surface acoustic wave duplexer can be easily reduced.

Accordingly, in the surface acoustic wave duplexer described in Japanese Unexamined Patent Application Publication No. 2003-249842, when a transmission filter and a reception filter defined by surface acoustic wave filter chips are mounted using a flip-chip bonding technique, a bonding wire need not be used.

Figure 10:
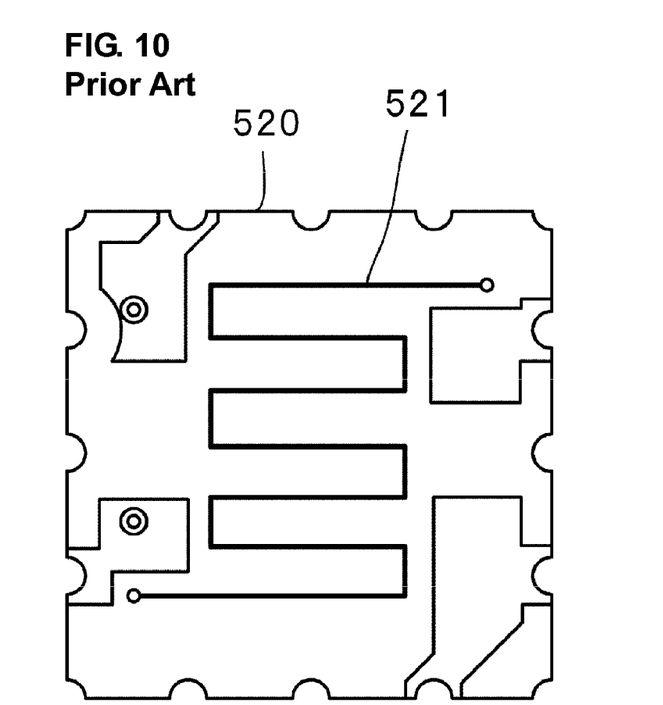
FIG. 10 is a schematic plan view illustrating a meander line pattern of a phase matching circuit provided in a laminated board of the known elastic wave duplexer.

On the other hand, in the surface acoustic wave duplexer 501, the matching circuit 508 is disposed between the antenna terminal 502 and the reception filter 507 so as to provide impedance matching. In the surface acoustic wave duplexer 501, this matching circuit 508 is defined by the meandering phase matching circuit pattern 521, as shown in FIG. 10. However, the inductance of the matching circuit 508 is obtained from not only the inductance of the phase matching circuit pattern 521 but also from the inductance of the bonding wire.

Accordingly, in the surface acoustic wave duplexer 501 described in Japanese Unexamined Patent Application Publication No. 2003-249842, the inductance value of the meandering phase matching circuit pattern 521 included in the laminated board can be reduced.

In contrast, in the structure in which a reception filter and a transmission filter are mounted on a laminated board using a flip-chip bonding technique, a bonding wire is not used. Therefore, the inductance of a bonding wire cannot be used. As a result, a line pattern of the impedance matching circuit that provides a large inductance in a small area is required. To meet such a requirement, a coil-shaped line pattern may be used. A coil-shaped line pattern can provide a large inductance, as compared to a meandering line pattern.

However, when a coil-shaped line pattern is provided on a laminated board, electromagnetic coupling occurs between the coil-shaped line pattern and one of a transmission filter and a reception filter. Therefore, the isolation characteristics may be deteriorated. In particular, if electromagnetic coupling occurs between the coil-shaped line pattern and the transmission filter, the isolation characteristic is deteriorated.

SUMMARY OF THE INVENTION

To overcome the problems described above, preferred embodiments of the present invention provide an elastic wave duplexer including a transmission filter chip and a reception filter chip each defined by an elastic wave filter that is flip-chip bonded to a laminated board. A coil-shaped line is provided inside the laminated board so as to connect an impedance matching circuit between the reception filter and an antenna terminal. Thus, electromagnetic coupling rarely occurs between the coil-shaped line pattern and one of the transmission filter and the reception filter, and therefore, deterioration of the isolation characteristic rarely occurs.

According to a preferred embodiment of the present invention, an elastic wave duplexer includes a transmission filter unit including an elastic wave filter, a reception filter unit including an elastic wave filter, a common connection end commonly connecting one end of the transmission filter unit to one end of the reception filter unit, and an impedance matching circuit unit connected between the common connection end and the reception filter unit. As used herein, the term "elastic wave filter" refers to a filter using a wide variety of elastic waves, such as a surface acoustic wave filter and a boundary elastic wave filter using boundary elastic waves, for example.

Note that a boundary elastic wave filter is a filter device including an IDT electrode and a reflector provided on a piezoelectric substrate. For example, by providing an IDT electrode and a reflector on a single-crystal piezoelectric substrate and providing a thin film having a relatively large thickness, such as an $SiO_2$ film, on the substrate, a boundary elastic wave filter can be produced. The operation principal and the structure of a boundary elastic wave filter are substantially the same as those of a surface acoustic wave filter. However, in a boundary elastic wave filter, a solid layer preferably made from, for example, $SiO_2$, is provided on a surface of the single-crystal piezoelectric substrate, and elastic waves propagating in the boundary between the single-crystal piezoelectric substrate and the solid layer, that is, boundary elastic waves are used. Since, in a boundary elastic wave filter, boundary elastic waves propagate in the boundary between the single-crystal piezoelectric substrate and the solid body, a package having a cavity is not required. Thus, the size of the device can be reduced.

For the above-described boundary elastic wave filter, boundary elastic waves propagating in the boundary between the single-crystal piezoelectric substrate and the solid layer are preferably used. However, since the operation principle is substantially the same as that of a surface acoustic wave filter, a design method used for a boundary elastic wave filter is similar to that used for a surface acoustic wave filter. Therefore, according to preferred embodiments of the present invention, a boundary elastic wave filter is used for the above-described elastic wave filter, in addition to a surface acoustic wave filter.

According to a preferred embodiment of the present invention, the transmission filter unit and the reception filter unit are defined by a transmission filter chip and a reception filter chip that are flip-chip bonded onto a laminated board using a face-down method, respectively.

Since a transmission filter chip and a reception filter chip are flip-chip bonded using a face-down method, the size of the surface acoustic wave duplexer according to a preferred embodiment of the present invention can be reduced, as compared to that of a surface acoustic wave duplexer using a bonding wire connection method.

In addition, in the elastic wave duplexer according to a preferred embodiment of the present invention, the transmission filter chip is preferably a ladder filter including a first piezoelectric substrate. The transmission filter chip includes an input terminal and an output terminal. The reception filter chip is preferably a longitudinally coupled resonator type filter including a second piezoelectric substrate. The reception filter chip preferably includes a reception input terminal and first and second reception terminals and has a balanced-unbalanced conversion function.

Furthermore, an interconnection pattern including first and second electrode lands electrically connected to the transmission filter chip and the reception filter chip are preferably provided on the laminated board of the elastic wave duplexer. A matching circuit pattern is preferably provided on the laminated board. The matching circuit pattern defines the impedance matching circuit unit. The laminated board includes a plurality of insulating layers. The matching circuit pattern includes a plurality of conductor patterns and a plurality of via hole patterns to electrically connect the plurality of conductor patterns with one another. The matching circuit pattern preferably further includes a coil-shaped line extending across the plurality of insulating layers. One end of the matching circuit pattern is connected to the electrode land, and the other end is connected to a ground potential.

Still furthermore, the transmission filter chip is preferably disposed on one side of a center line extending in a direction between the first edge and the opposite second edge of the laminated board and passing through the center of the laminated board, and the reception filter is disposed on the other side of the center line.

Yet still furthermore, the matching circuit pattern preferably includes a coil-shaped line. In plan view, the approximate center of the coil-shaped line is located on a side of the center line of the elastic wave duplexer on which the reception filter chip is disposed.

In the elastic wave duplexer according to a preferred embodiment of the present invention, it is preferable that, in plan view, the approximate center of the coil-shaped line is located at a location corresponding to a vertex of an isosceles triangle having a base extending on substantially the same line between the first reception terminal and the second reception terminal. In such a case, the isolation characteristic can be further improved.

According to a preferred embodiment of the present invention, it is preferable that the elastic wave duplexer further includes a shield electrode disposed between the matching circuit pattern and the interconnection pattern, and the shield electrode is connected to the ground potential. In such a case, the isolation characteristic can be further improved.

In the elastic wave duplexer according to a preferred embodiment of the present invention, it is preferable that the interconnection pattern further includes a transmission signal interconnection pattern and a transmission ground interconnection pattern, and, in plan view, the coil-shaped line preferably does not overlap with the transmission signal interconnection pattern and a transmission ground interconnection pattern. In such a case, the isolation characteristic can be further improved.

In the elastic wave duplexer according to a preferred embodiment of the present invention, it is preferable that the ladder filter includes a parallel-arm resonator and a series-arm resonator, the transmission filter chip further includes a bump connected to one end of the parallel-arm resonator, an electrode land connected to the bump is provided on the laminated board, and a series inductor is disposed between the electrode land and a ground potential. In such a case, the filter characteristic of a filter located in a relatively low-frequency device side has a wide band width while maintaining an outstanding isolation characteristic.

In the elastic wave duplexer according to a preferred embodiment of the present invention, it is preferable that an external terminal is provided on a surface of the laminated board opposite to a surface thereof on which the transmission filter chip and the reception filter chip are mounted, and the shield electrode is electrically connected to the external terminal using a plurality of via hole electrodes extending through the laminated board. Accordingly, the isolation characteristic can be further improved.

In the elastic wave duplexer according to a preferred embodiment of the present invention, it is preferable that the longitudinally coupled resonator type filter included in the reception filter chip includes a first longitudinally coupled resonator type filter unit electrically connected to the first reception terminal and a second longitudinally coupled resonator type filter unit electrically connected to the second reception terminal, the phase of an output signal with respect to an input signal input to the second longitudinally coupled resonator type filter unit is different from the phase of an output signal with respect to an input signal input to the first longitudinally coupled resonator type filter unit by about 180 degrees, an electrical signal flows in the transmission filter chip in a direction from the second edge to the first edge of the laminated board, a direction of an electrical signal flowing in the first longitudinally coupled resonator type filter unit is substantially the same as the direction from the second edge to the first edge, in plan view, and a direction of an electrical signal flowing in the second longitudinally coupled resonator type filter unit is substantially the same as a direction from the first edge to the second edge, in plan view. In such a case, the isolation characteristic, particularly in a reception band, can be further improved.

In the elastic wave duplexer according to a preferred embodiment of the present invention, in plan view, the approximate center of the coil-shaped line is located on a side of the center line of the elastic wave duplexer on which the reception filter chip is disposed. Since the reception filter chip has a balanced-unbalanced conversion function, that is, the reception output is a balanced output, electromagnetic coupling rarely occurs, as compared to a signal in the transmission filter. Accordingly, since a coil-shaped line is not disposed in the vicinity of the transmission filter, the isolation characteristic is improved.

Consequently, according to a preferred embodiment of the present invention, the size of the elastic wave duplexer can be reduced, and the isolation characteristic of the elastic wave duplexer can be improved. In particular, deterioration of the isolation characteristic caused by electromagnetic coupling between the transmission filter and the coil-shaped line defining the impedance matching circuit can be effectively prevented.

In addition, according to a preferred embodiment of the present invention, the coil-shaped line provides a large inductance while occupying a relatively small area. Accordingly, the size of an elastic wave duplexer defined by a flip-chip bonding technique without using a bonding wire can be further reduced.

As a result, according to a preferred embodiment of the present invention, a compact elastic wave duplexer having an outstanding isolation characteristic can be provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention are described below with reference to the accompanying drawings.

Figure 2:
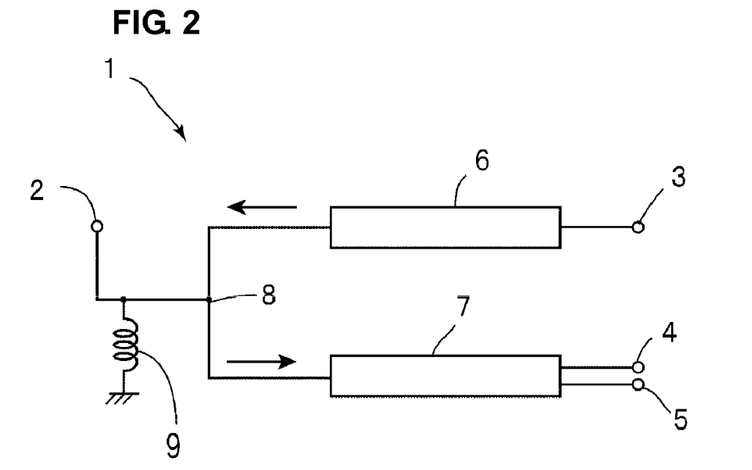
FIG. 2 is a block diagram illustrating a circuit configuration of an elastic wave duplexer according to a preferred embodiment of the present invention.

FIG. 2 is a block diagram of an elastic wave duplexer according to a preferred embodiment of the present invention. According to the present preferred embodiment, an elastic wave duplexer 1 is a duplexer for CDMA800. For a CDMA800 duplexer, the transmission passband ranges from about 824 MHz to about 849 MHz, and the reception passband ranges from about 869 MHz to about 894 MHz.

The elastic wave duplexer 1 includes an antenna terminal 2 connected to an antenna, a transmission terminal 3, a first reception terminal 4, and a second reception terminal 5. One end of a transmission filter chip 6 and one end of a reception filter chip 7 are connected to the antenna terminal 2. The other end of the transmission filter chip 6 defines the transmission terminal 3. The other end of the reception filter chip 7 defines the first reception terminal 4 and the second reception terminal 5. That is, the reception filter chip 7 is defined by a balanced elastic wave filter having a balanced-unbalanced conversion function.

In addition, a common terminal 8 is connected to the antenna terminal 2. An impedance matching circuit 9 is connected between the common terminal 8 and a ground potential. In the elastic wave duplexer 1, the impedance matching circuit 9 is disposed in a portion connected to the antenna in order to provide impedance matching between the transmission filter chip 6 and the reception filter chip 7.

For the elastic wave duplexer 1, outstanding isolation must be obtained between the transmission terminal 3 and each of the first and second reception terminals 4 and 5.

According to the present preferred embodiment, the circuit of the elastic wave duplexer 1 is designed so that the characteristic impedance of each of the common terminal 8 and the transmission terminal 3 is preferably about 50Ω, for example, and the impedance of each of the first and second reception terminals 4 and 5 is preferably about 100Ω, for example.

Figure 1A:
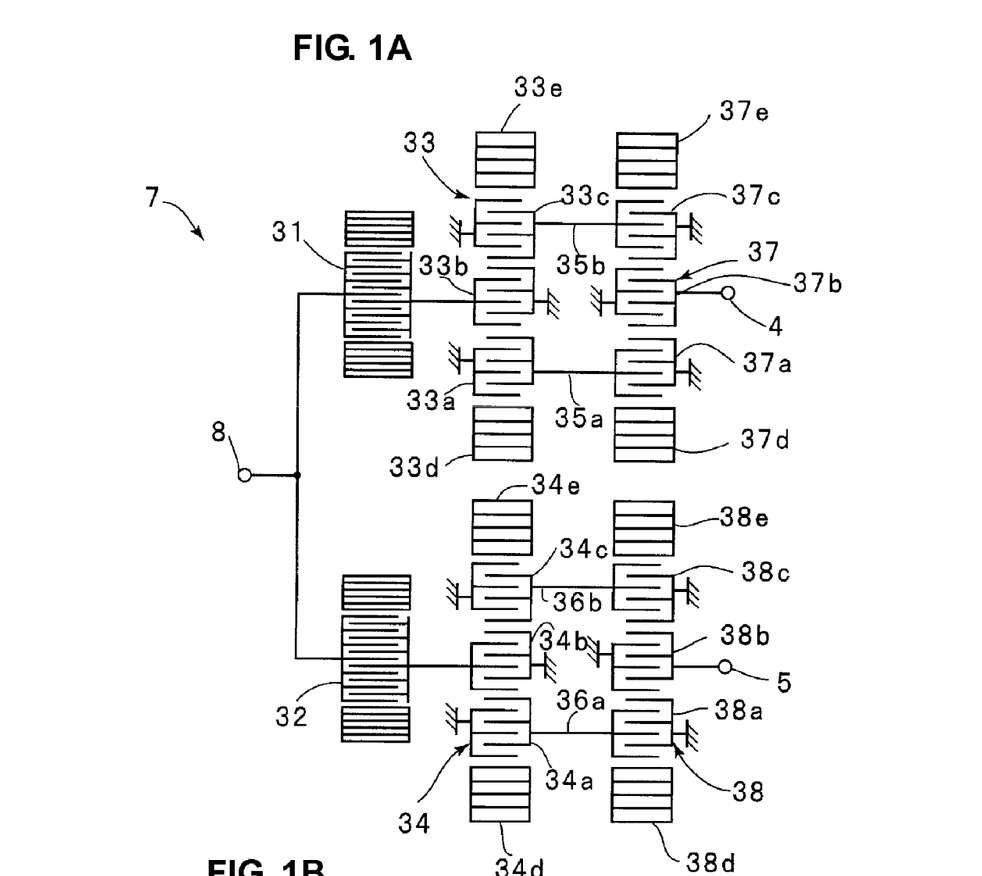
FIG. 1A illustrates a circuit configuration of a reception filter chip of an elastic wave filter according to a preferred embodiment of the present invention.
Figure 1B:
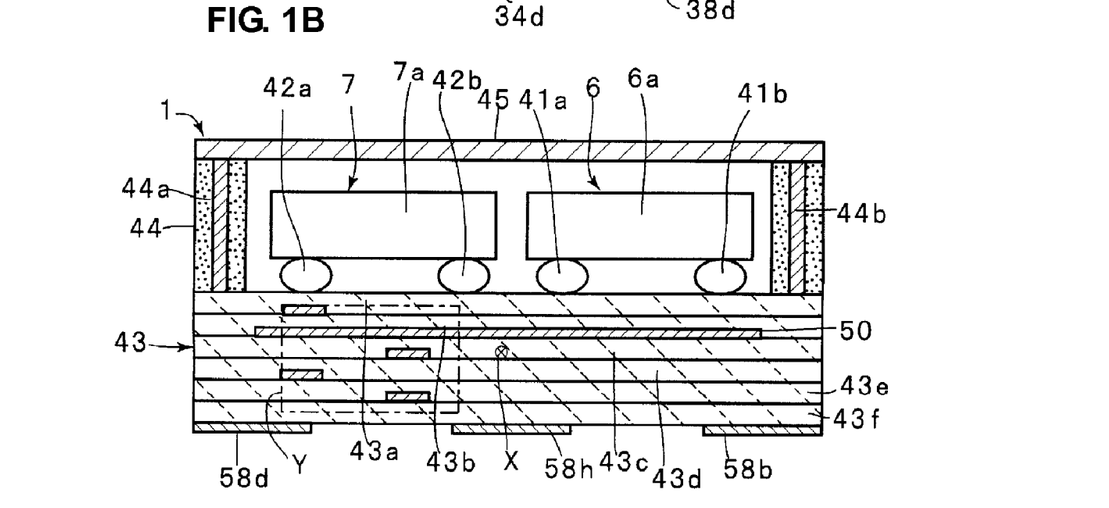
FIG. 1B is a front sectional view of the elastic wave duplexer according to a preferred embodiment of the present invention.
Figure 3:
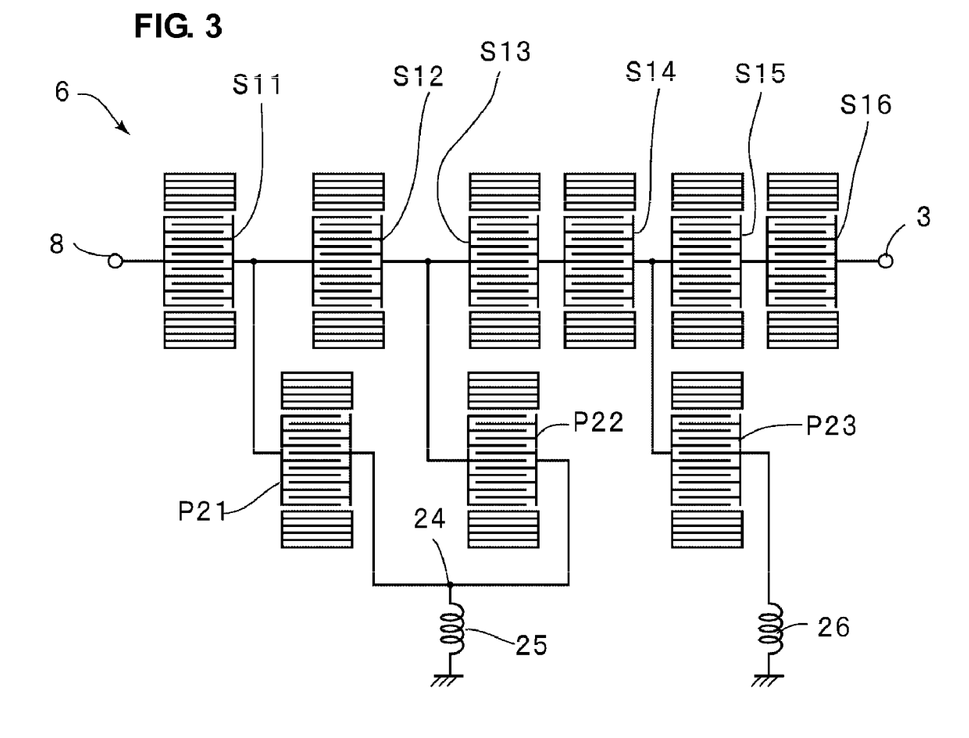
FIG. 3 is a schematic illustration of a circuit configuration of a transmission filter chip of the elastic wave duplexer according to a preferred embodiment of the present invention.

FIG. 1A is a circuit diagram schematically illustrating the circuit configuration of the reception filter chip 7 of the elastic wave duplexer 1. FIG. 3 is a circuit diagram schematically illustrating the circuit configuration of the transmission filter chip 6. FIG. 1B is a front sectional view illustrating the structural configuration of the elastic wave duplexer 1.

As shown in FIG. 3, in the transmission filter chip 6, series-arm resonators S11 to S16 are connected to series branches disposed between the common terminal 8 and the transmission terminal 3. In addition, a plurality of parallel branches are disposed between the series branch and a ground potential. One of parallel-arm resonators P21, P22, and P23 is disposed in a corresponding one of the parallel branches. One end of the parallel-arm resonator P21 and one end of the parallel-arm resonator P22 are commonly connected to each other using a common connection point 24. An inductance 25 is disposed between the common connection point 24 and the ground potential. In addition, an inductance 26 is disposed between the parallel-arm resonator P23 and the ground potential.

As described above, the transmission filter chip 6 includes a ladder filter having the plurality of series-arm resonators S11 to S16 and the plurality of parallel-arm resonators P21 to P23. Note that each of the series-arm resonators S11 to S16 and the parallel-arm resonators P21 to P23 is defined by a one-port surface acoustic wave resonator including reflectors disposed at either end of an IDT electrode in a surface wave propagation direction.

That is, the transmission filter chip 6 is a surface acoustic wave filter device having a ladder circuit configuration.

On the other hand, as shown in FIG. 1A, in the reception filter chip 7, a first longitudinally coupled resonator type surface acoustic wave filter unit 33 and a second longitudinally coupled resonator type surface acoustic wave filter unit 34 are connected to the common terminal 8 via one-port SAW resonators 31 and 32, respectively. The first and second longitudinally coupled resonator type surface acoustic wave filter units 33 and 34 are 3-IDT longitudinally coupled resonator type surface acoustic wave filter units. Accordingly, the first and second longitudinally coupled resonator type surface acoustic wave filter units 33 and 34 include first to third IDTs 33a to 33c and first to third IDTs 34a to 34c arranged in a surface wave propagation direction, respectively. Reflectors 33d and 33e are disposed on either side of a portion in which the IDTs 33a to 33c are disposed in the surface acoustic wave propagation direction. Similarly, in the second longitudinally coupled resonator type surface acoustic wave filter unit 34, reflectors 34d and 34e are disposed on either side of a portion in which the IDTs 34a to 34c are disposed in the surface acoustic wave propagation direction.

One end of the second IDT 33b located in the approximate middle is connected to the common terminal 8 via the elastic wave resonator 31. One end of the first IDT 33a and one end of the third IDT 33c disposed on either side of the second IDT 33b, are connected to the ground potential. The other end of the second IDT 33b is connected to the ground potential. The other end of the first IDT 33a and the other end of the third IDT 33c are connected to signal lines 35a and 35b, respectively.

Similarly, in the second longitudinally coupled resonator type surface acoustic wave filter unit 34, one end of the first IDT 34b located in the approximate middle is connected to the common terminal 8 via the surface acoustic wave resonator 32. The other end is connected to the ground potential. The other end of the second IDT 33b is connected to the ground potential. One end of the first IDT 34a and one end of the third IDT 34c are connected to the ground potential. The other end of the first IDT 34a and the other end of the third IDT 34c are connected to signal lines 36a and 36b, respectively.

Third and fourth longitudinally coupled resonator type surface acoustic wave filter units 37 and 38 are connected downstream of the first and second longitudinally coupled resonator type surface acoustic wave filter units 33 and 34, respectively. Similar to the first and second longitudinally coupled resonator type surface acoustic wave filter units 33 and 34, the longitudinally coupled resonator type surface acoustic wave filter units 37 and 38 are 3-IDT longitudinally coupled resonator type surface acoustic wave filter units. Accordingly, in the longitudinally coupled resonator type surface acoustic wave filter unit 37, first to third IDTs 37a to 37c and reflectors 37d and 37e are provided. Similarly, in the fourth longitudinally coupled resonator type surface acoustic wave filter unit 38, first to third IDTs 38a to 38c and reflectors 38d and 38e are provided.

One end of the first IDT 37a and one end of the third IDT 37c are connected to the first and third IDTs 33a and 33c of the first longitudinally coupled resonator type surface acoustic wave filter unit 33 using the signal lines 35a and 35b, respectively. The other end of the IDT 37a and the other end of the IDT 37c are connected to the ground potential. In addition, one end of the IDT 37b located in the approximate middle is connected to the ground potential, and the other end is connected to the first reception terminal 4.

Similarly, one end of the first IDT 38a and one end of the third IDT 38c of the fourth longitudinally coupled resonator type surface acoustic wave filter unit 38 are connected to the first and third IDTs 34a and 34c of the second longitudinally coupled resonator type surface acoustic wave filter unit 34 using the signal lines 36a and 36b, respectively. The other end of the IDT 38a and the other end of the IDT 38c are connected to the ground potential. In addition, one end of the IDT 38b is connected to the ground potential, and the other end is connected to the second reception terminal 5.

The first to fourth longitudinally coupled resonator type surface acoustic wave filter units 33, 34, 37 and 38 are configured such that the phase of a signal flowing from the antenna terminal 2 to the first reception terminal 4 is different from the phase of a signal flowing from the antenna terminal 2 to the second reception terminal 5 by about 180 degrees. More specifically, the second IDT 38b located in the approximate middle of the fourth longitudinally coupled resonator type surface acoustic wave filter unit 38 is inverted with respect to the second IDT 37b located in the approximate middle of the third longitudinally coupled resonator type surface acoustic wave filter unit 37. Thus, the phase of a signal output from the reception terminal 5 is different from the phase of a signal output from the reception terminal 4 by about 180 degrees.

However, according to preferred embodiments of the present invention, the circuit configuration of a reception filter chip having a balanced-unbalanced conversion function is not limited to the configuration shown in FIG. 1A. That is, the circuit of the reception filter chip can be provided using any appropriate elastic wave filter circuit having a balanced-unbalanced conversion function.

As shown in FIG. 1B, the transmission filter chip 6 having the above-described circuit configuration and the reception filter chip 7 are mounted on a laminated board 43 using a flip-chip bonding technique and using bumps 41a, 41b, 42a, and 42b. The laminated board 43 is preferably made of, but not limited to, a ceramic multilayer board formed by firing a plurality of ceramic green sheets stacked with an electrode material therebetween at the same time.

The transmission filter chip 6 includes a first piezoelectric substrate 6a. The first piezoelectric substrate 6a includes an electrode structure that provides the circuit configuration shown in FIG. 3. The reception filter chip 7 includes a second piezoelectric substrate 7a. The second piezoelectric substrate 7a includes the electrode structure shown in FIG. 1A so as to provide a reception filter circuit.

In FIG. 1B, only the bumps 41a, 41b, 42a, and 42b are shown. However, in practice, as described below, additional bumps are provided to connect the transmission filter chip 6 and the reception filter chip 7 to the laminated board 43.

In the elastic wave duplexer 1 of the present preferred embodiment, as described above, the transmission filter chip 6 and the reception filter chip 7 are mounted on the laminated board 43 using a face-down flip-chip bonding technique and the bumps 41a, 41b, 42a, and 42b. That is, since a bonding wire is note required, the area of a top surface of the laminated board 43 on which the transmission filter chip 6 and the reception filter chip 7 are stacked can be reduced. Accordingly, the size of the elastic wave duplexer 1 can be reduced. In addition, since a complicated manufacturing operation using a bonding wire is not required, the productivity can be increased.

Note that the bumps 41a, 41b, 42a, and 42b are preferably made of an appropriate conductive material, such as gold, for example.

A frame-shaped casing member 44 is integrally mounted on the top surface of the laminated board 43 so as to substantially surround the transmission filter chip 6 and the reception filter chip 7. The frame-shaped casing member 44 is preferably provided on the top surface of the laminated board 43 in an integrated manner. The frame-shaped casing member 44 may be provided separately from the laminated board 43 and may be connected to the top surface of the laminated board 43. Alternatively, the frame-shaped casing member 44 and the laminated board 43 may preferably be formed at the same time using a ceramic firing technique.

A cover member 45 is fixed to the frame-shaped casing member 44 so as to close the upper opening of the frame-shaped casing member 44. The cover member 45 is preferably made from a conductive material, such as a metal, for example. According to the present preferred embodiment, the cover member 45 is made from a metal. A plurality of via hole electrodes 44a and 44b are provided inside the frame-shaped casing member 44. The top end of each of the via hole electrodes 44a and 44b is connected to the cover member 45. The bottom end of each of the via hole electrodes 44a and 44b is connected to the laminated board 43 and is electrically connected to an electrode connected to the ground potential. Accordingly, a space in which the transmission filter chip 6 and the reception filter chip 7 are disposed is substantially surrounded by the cover member 45 and the via hole electrodes 44a and 44b. Thus, the space is electromagnetically shielded.

The laminated board 43 preferably includes a plurality of stacked insulating layers 43a to 43f. In addition, terminals 58b, 58d, and 58h are arranged on the bottom surface of the laminated board 43. The terminals 58b, 58d, and 58h are used to be electrical connected to the outside. In FIG. 1B, only the three external terminals 58b, 58d, and 58h are shown. However, in practice, as described below with reference to FIG. 6D, external terminals 58a to 58i are provided. The external terminals 58a to 58i are connected to the antenna terminal 2, the transmission terminal 3, the first and second reception terminals 4 and 5, and the ground potential.

FIG. 4, FIGS. 5A to 5D, FIGS. 6A to 6D, and FIGS. 7A to 7D are schematic plan views illustrating electrode patterns disposed at various heights in the elastic wave duplexer 1.

Figure 4:
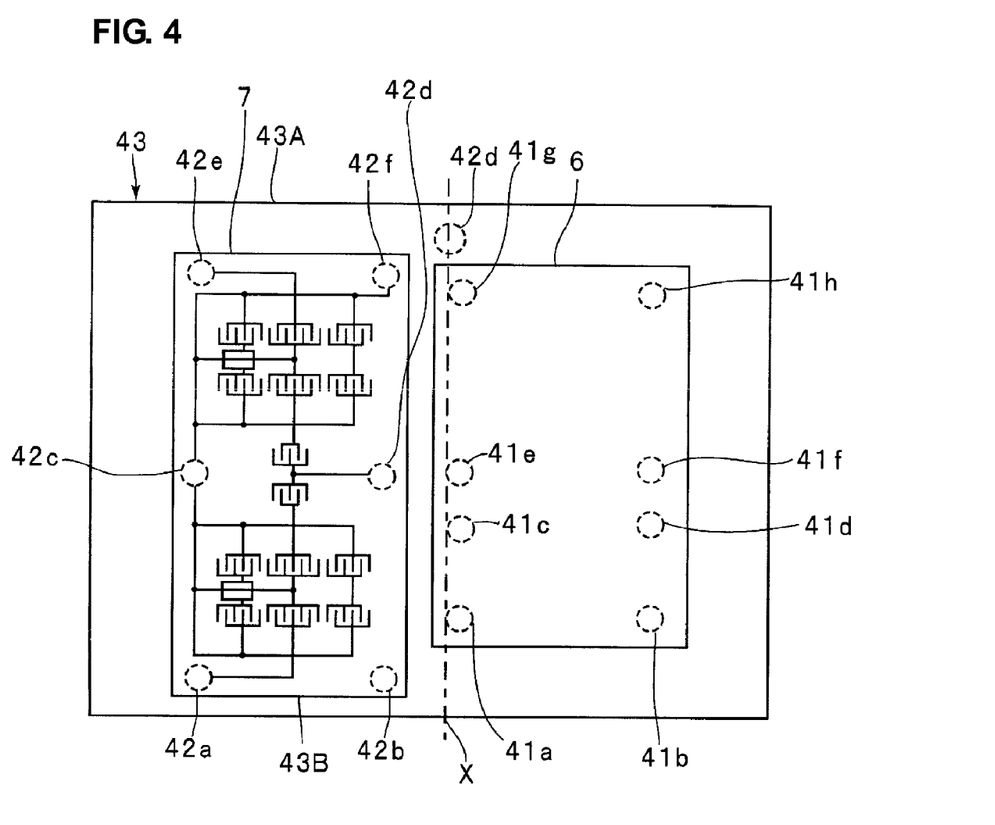
FIG. 4 is a schematic plan view illustrating a main portion of the elastic wave duplexer according to a preferred embodiment of the present invention, in which the transmission filter chip and the reception filter chip are mounted on a laminated board.
Figure 5A:
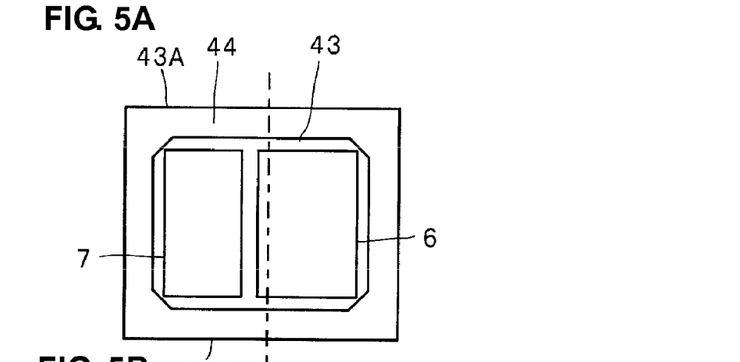
FIG. 5A is a schematic plan view viewed when a cover member is removed from the elastic wave duplexer according to a preferred embodiment of the present invention.

FIG. 4 and FIG. 5A are schematic plan views when the cover member 45 is removed from the elastic wave duplexer 1. As shown in FIGS. 4 and 5A, the transmission filter chip 6 and the reception filter chip 7 are mounted inside an area substantially surrounded by the frame-shaped casing member 44. In FIG. 4, the circuit configuration of the reception filter chip 7 is schematically shown. The locations of the bumps 42a to 42f provided on the bottom surface of the reception filter chip 7 are shown by dotted lines. Similarly, the positions of the bumps 41a to 41h provided on the bottom surface of the transmission filter chip 6 are shown by dotted lines.

The bump 42d is preferably connected to the common terminal 8 shown in FIG. 1. The bumps 42a and 42e are preferably connected to the first and second reception terminals 4 and 5, respectively. The other bumps 42b, 42c, and 42f preferably provide electrical connection to the ground potential.

In the transmission filter chip 6, the bump 41g is preferably connected to the common terminal 8. The bump 41b is preferably connected to the transmission terminal 3. The other bumps 41a, 41c, 41d, 41e, 41f, and 41h preferably provide mechanical connections and other electrical connections.

Figure 5B:
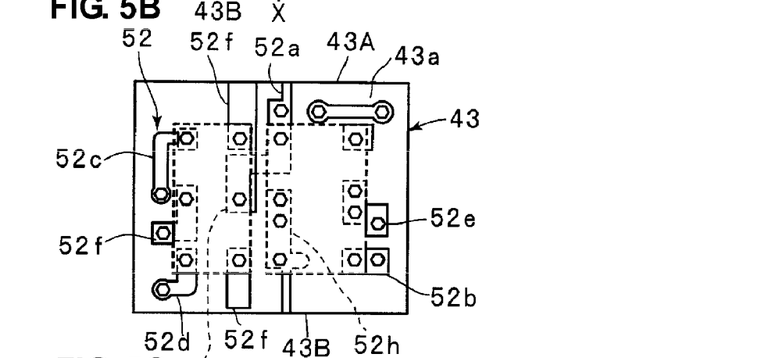
FIG. 5B is a plan view schematically illustrating an electrode pattern formed on the laminated board.

FIG. 5B is a plan view of the laminated board 43. An interconnection pattern shown in FIG. 5B is provided on the top surface of the insulating layer 43a defining the uppermost layer.

As in FIG. 4, in FIG. 5B, the external diameters of the transmission filter chip 6 and the reception filter chip 7 are schematically shown as alternate long and short dash lines. At the locations shown in the drawing, the metal bumps 41a to 41h provided on the bottom surface of the transmission filter chip 6 and the bumps 42a to 42f provided on the bottom surface of the reception filter chip 7 are electrically connected to the interconnection pattern provided on the top surface of the insulating layer 43*a*.

Although not shown in FIG. 1B, as shown in FIG. 5B, a plurality of electrode lands 52*a* to 52*f* are provided on the top surface of the insulating layer 43*a*, that is, the top surface of the laminated board 43. Each of the bumps 41*a* to 41*h* and 42*a* to 42*f* is electrically connected to one of the electrode lands.

According to the present preferred embodiment, an interconnection pattern 52 including the electrode lands 52*a* to 52*f* is arranged on the top surface of the laminated board 43.

Figure 5C:
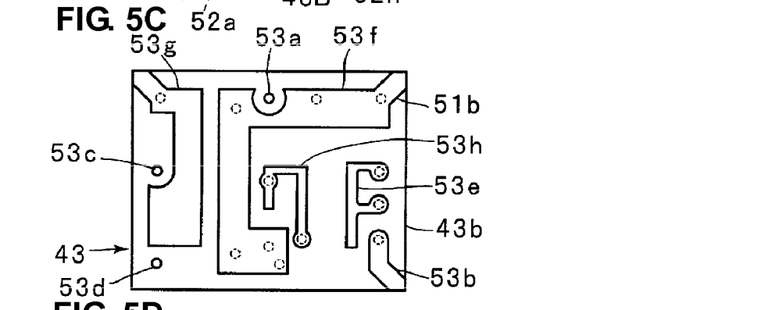
FIGS. 5C and 5D are schematic plan views of interconnection patterns formed in the laminated board at an intermediate height of the laminated board.

In addition, although not shown in FIG. 1B in detail, a conductor pattern and via hole electrodes shown in FIGS. 5C to 6C are provided in the laminated board 43. That is, the schematic plan views shown in FIGS. 5C to 6D correspond to the schematic plan views obtained at different heights inside the laminated board 43 from the top to the bottom. In FIG. 5C, an interconnection pattern provided on the insulating layer 43*b* is shown. This interconnection pattern preferably includes via hole electrodes 53*a*, 53*c*, and 53*d* and electrode patterns 53*b*, 53*e*, 53*f*, 53*g*, and 53*h*.

Figure 5D:
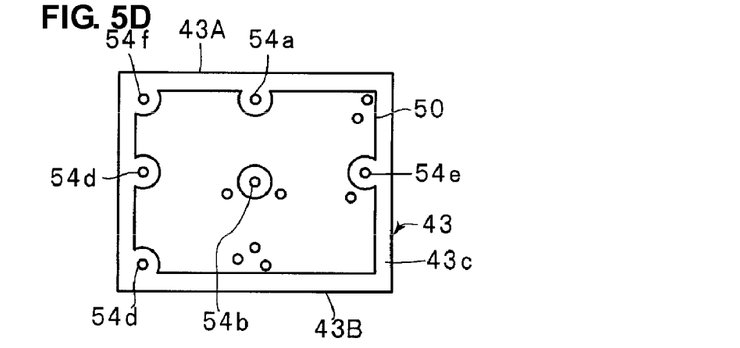

FIG. 5D is a plan view of a shield pattern 50 provided on the insulating layer 43*c*. The shield electrode 50 includes a substantially semicircular opening in the peripheral edge thereof. In addition, the shield electrode 50 has a substantially circular opening portion at the approximate center thereof. Via hole electrodes 54*a* to 54*f* are provided inside the substantially semicircular opening and the substantially circular opening portion so as not to be in contact with the shield electrode 50.

Figure 6A:
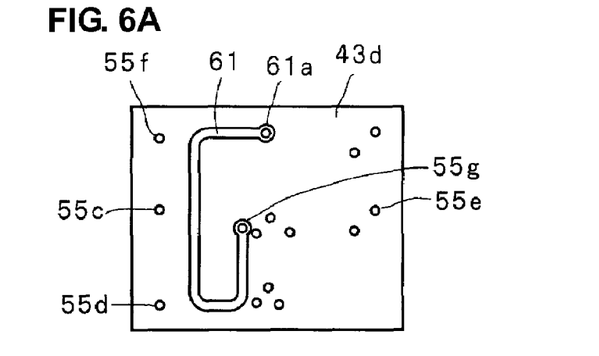
FIGS. 6A to 6C are schematic plan sectional views illustrating coil-shaped line pattern portions disposed in the laminated board.
Figure 6B:
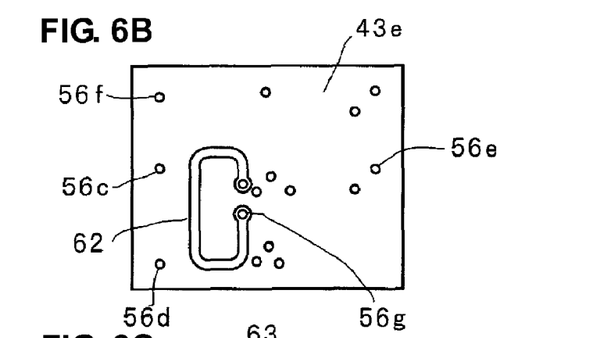
Figure 6C:
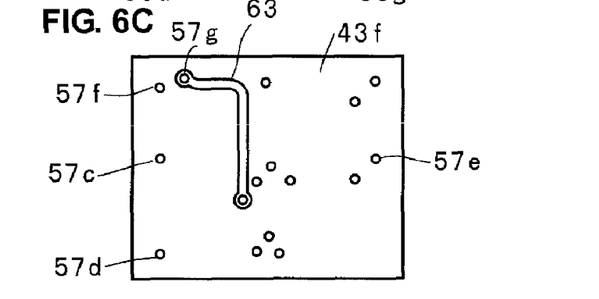
Figure 6D:
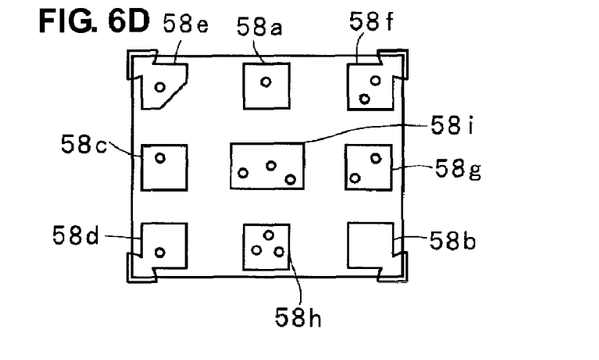
FIG. 6D is a schematic plan view illustrating a plurality of external terminals provided on the bottom surface of the laminated board.
Figure 7A:
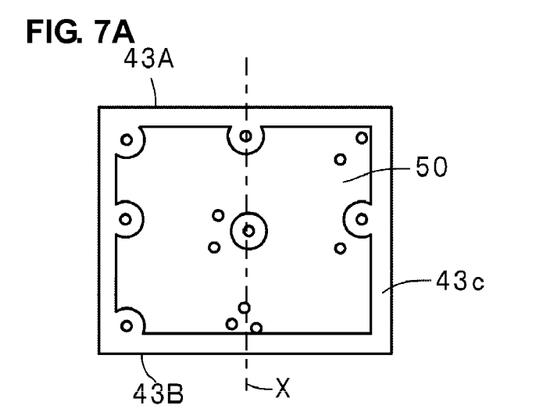
FIGS. 7A to 7D are schematic plan views illustrating the shapes and locations of coil-shaped electrode pattern portions disposed in a laminated board of an elastic wave duplexer of a comparative example.
Figure 7B:
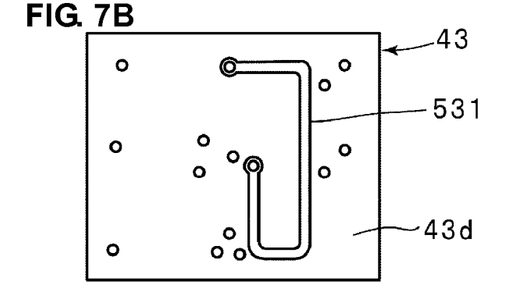
Figure 7C:
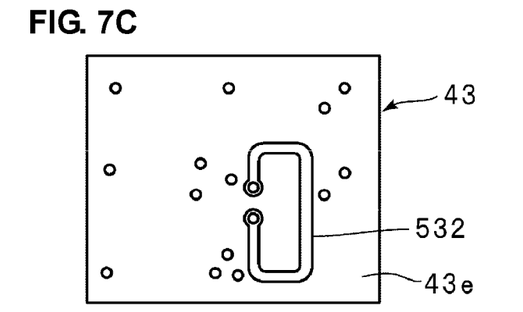
Figure 7D:
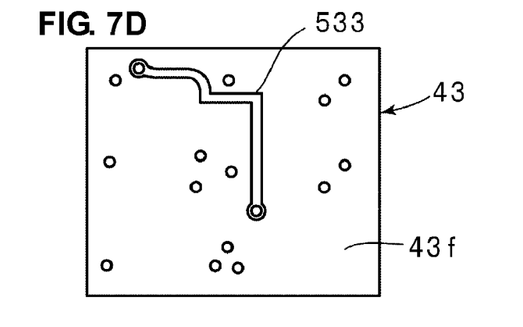

In FIG. 6A, an area in which a coil-shaped line pattern 61 is provided on the insulating layer 43*d* is shown. One end 61*a* of the coil-shaped line pattern 61 is connected to the via hole electrode 54*a* and is electrically connected to an electrode land to which one end of the transmission filter chip 6 and one end of the reception filter chip 7 are commonly connected, wherein the transmission filter chip 6 and the reception filter chip 7 are mounted on the laminated board 43. The other end of the coil-shaped line pattern 61 is connected to a via hole electrode 55*g*. As shown in FIG. 6B, the via hole electrode 55*g* is connected to one end of a coil-shaped line pattern 62, which is provided at a location below that of the coil-shaped line pattern 61. The other end of the coil-shaped line pattern 62 is connected to a via hole electrode 56*g*. As shown in FIG. 6C, the via hole electrode 56*g* is connected to one end of a coil-shaped line pattern 63, which is provided at a location below that of the coil-shaped line pattern 62. The other end of the coil-shaped line pattern 63 is connected to a via hole electrode 57*g*. The via hole electrode 57*g* is connected to an external terminal 58*e* provided on the bottom surface of the laminated board 43 (FIG. 6D).

The coil-shaped line patterns 61 to 63 are electrically connected together using the via hole electrodes 55*g*, 56*g*, and 57*g*. Thus, according to the present preferred embodiment, a coil-shaped line defining an impedance matching circuit is provided. That is, the coil-shaped line including the coil-shaped line patterns 61 to 63 and the via hole electrodes 55*g*, 56*g*, and 57*g* is provided in the plurality of insulating layers 43*d* to 43*f*. Accordingly, the coil-shaped line is arranged to provide a large inductance and yet occupy a relatively small area.

Note that an external terminal 58*a* is an external terminal corresponding to the antenna terminal 2.

In the elastic wave duplexer 1 according to the present preferred embodiment, the transmission filter chip 6 and the reception filter chip 7 are disposed on either side of a center line X passing through the approximate center of the laminated board 43 and extending between a first edge 43A of the laminated board 43 and a second edge 43B opposite the first edge 43A (refer to FIGS. 4 and 5A). In addition, a coil-shaped line Y including the coil-shaped line patterns 61 to 63 is disposed inside the laminated board 43. In FIG. 1B, the center line X extends in a direction from the front to the back of the plane of FIG. 1B. Accordingly, a point through which the center line X extends is shown by a symbol "x" surrounded by "O". That is, the approximate center of the coil-shaped line Y is located on the side of the center line X on which the reception filter chip 7 is disposed. Therefore, the coil-shaped line Y is spaced apart from the transmission filter chip 6. If the distance between the transmission filter chip 6 and the coil-shaped line Y is relatively small, the isolation characteristic is deteriorated by the electromagnetic coupling between the coil-shaped line Y and the reception filter chip 7, which is problematic.

The reception filter chip 7 has a balanced-unbalanced function, and a balanced output can be obtained from the first and second reception terminals 4 and 5. Accordingly, as compared to the transmission filter chip 6, the isolation characteristic of the reception filter chip 7 is rarely deteriorated by the electromagnetic coupling.

Thus, in the elastic wave duplexer 1 according to the present preferred embodiment, the transmission filter chip 6 having the isolation characteristic that is easily deteriorated by the electromagnetic coupling with the coil-shaped line is disposed so as to be distant from the coil-shaped line. Therefore, deterioration of the isolation characteristic can be reliably prevented. In this manner, the elastic wave duplexer 1 having an excellent isolation characteristic is provided.

Figure 8:
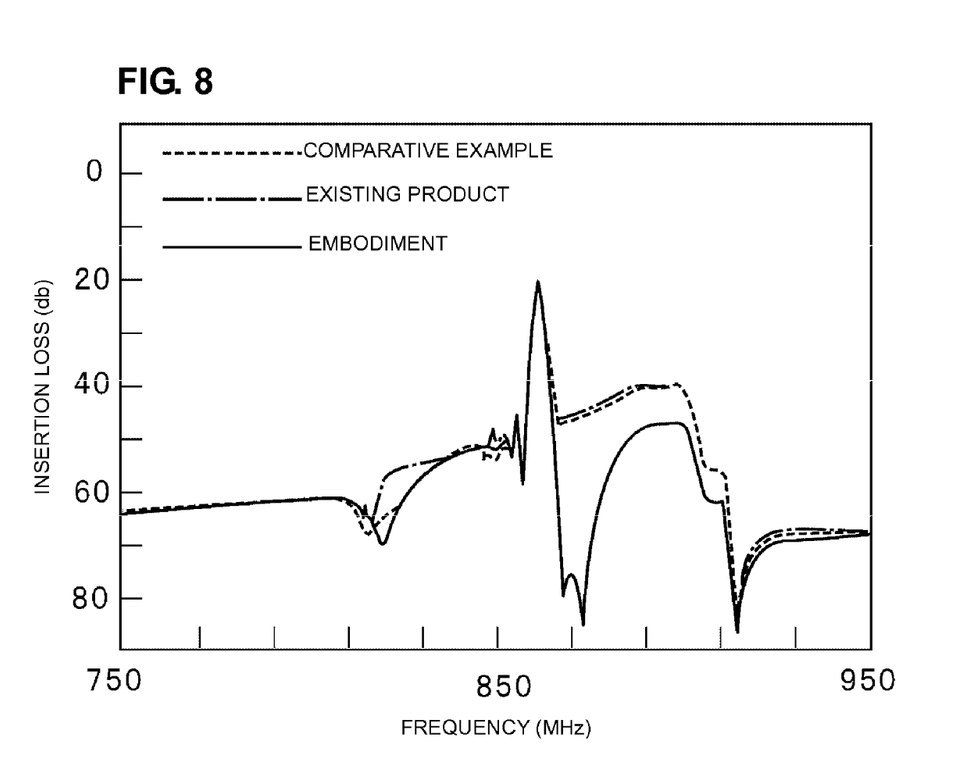
FIG. 8 illustrates the isolation characteristic of an elastic wave duplexer according to a preferred embodiment of the present invention and the isolation characteristic of a comparative example.

FIG. 8 illustrates the isolation characteristic of the elastic wave duplexer 1 according to the present preferred embodiment, the isolation characteristic of a comparative example, and the isolation characteristic of an existing product.

In FIG. 8, the result of the present preferred embodiment is shown as a solid line, the result of the comparative example is shown as a broken line, and the result of the known product is shown as an alternate long and short dash line. In the comparative example, the elastic wave duplexer is similar to the above-described preferred embodiment except that, as shown in FIGS. 7A to 7D, coil-shaped line pattern portions 531 to 533 are provided on a plurality of insulating layers so as to be located under the side on which the transmission filter chip 6 is mounted. In addition, as shown in FIG. 10, the known product includes a meandering matching circuit pattern 521 provided over substantially the entire laminated body.

As shown in FIG. 8, according to the present preferred embodiment, the isolation characteristic is about 52.0 dB in the transmission passband and is about 47.0 dB in the reception passband. In contrast, according to the comparative example, the isolation characteristic is about 54.0 dB in the transmission passband and is about 39.7 dB in the reception passband. According to the known product, the isolation characteristic is about 51.2 dB in the transmission passband and is about 40.5 dB in the reception passband. Accordingly, in the comparative example and the known product, a sufficient isolation characteristic is not obtained. In contrast, according to the present preferred embodiment, an outstanding isolation characteristic is achieved in both transmission passband and reception passband.

If the approximate center of the coil-shaped line of the impedance matching circuit is located so as to be adjacent to the side on which the reception filter chip 7 is mounted, the electromagnetic coupling between the reception filter chip 7 and the coil-shaped line is increased, and therefore, the isolation characteristic in the transmission band may be significantly deteriorated. However, according to the present preferred embodiment, such deterioration of the isolation characteristic in the transmission passband can be prevented. The reason for this phenomenon has yet to be established. However, a possible cause is that a balanced-output longitudinally coupled resonator type surface acoustic wave filter is used for the reception filter chip 7.

That is, in a balanced output circuit configuration, a signal level is determined by the difference between the amplitudes and phases of a high-frequency signals output from first and second reception terminals. Therefore, the amount of external noise is relatively small as compared to a balanced output circuit configuration. Accordingly, the electromagnetic coupling with the line pattern defining an impedance matching circuit is less in a balanced output circuit than in a circuit of another type. Consequently, when a reception filter chip has a balanced output circuit configuration, the deterioration of the isolation characteristic is minimized.

As described above, in the elastic wave duplexer 1 according to the present preferred embodiment, the transmission filter chip 6 and the reception filter chip 7 including an elastic wave filter are preferably mounted on the laminated board 43 using a flip-chip bonding technique. Thus, the size of the elastic wave duplexer 1 can be reduced. In addition, a coil-shaped line defining the impedance matching circuit is disposed on the laminated board on the side on which the reception filter chip 7 is mounted. Thus, the coil-shaped line is spaced apart from the transmission filter. Accordingly, a large inductance can be obtained from the coil-shaped line while reducing the isolation characteristic caused by electromagnetic coupling between the coil-shaped line having the large inductance and the transmission filter.

In addition, since the reception filter chip 7 has a balanced output circuit configuration, an affect on the isolation characteristic is relatively small even when electromagnetic coupling occurs between the reception filter chip 7 and the coil-shaped line. Accordingly, the size of the elastic wave duplexer 1 can be reduced, and the isolation characteristic of the elastic wave duplexer 1 can be improved.

Note that, since the coil-shaped pattern defining the impedance matching circuit is electromagnetically coupled with the interconnection pattern, signal leakage may occur, and therefore, the isolation characteristic may be deteriorated. In particular, coupling between a transmission interconnection portion including the electrode land 52*b* and the electrode pattern 53*b* and each of the electrode lands 52*e* and 53*e* has a large impact. A sneak path of a signal flowing from the ground to a signal interconnection line may be generated in this portion, and therefore, the isolation characteristic may be deteriorated.

In contrast, since the electrode land 52*a* and the via hole electrode 53*a* defining an interconnection line on the antenna side are preferably directly connected to the coil-shaped line, the deterioration of the isolation characteristic caused by electromagnetic coupling rarely occurs.

In addition, according to the present preferred embodiment, the shield electrode 50 is provided. Since the shield electrode 50 separates the upper interconnection pattern from the lower coil-shaped line, the capacitive coupling between the interconnection pattern and the coil-shaped line can be reduced. Thus, the isolation characteristic can be further improved.

However, the shield electrode cannot reduce inductive coupling caused by a magnetic field. Accordingly, according to the present preferred embodiment, by disposing the coil-shaped line on the side on which the first and second reception terminals are provided, the distance between an interconnection pattern other than the signal interconnection portion on the antenna side in which the electrode land 52*a* and the via hole electrode 53*a* are disposed and the coil-shaped line can be increased. Thus, an area of overlapping portions in the substantially vertical direction can be reduced. In this manner, the inductive coupling is reduced, and therefore, the isolation characteristic can be further improved.

In such a configuration, preferably, the coil-shaped line does not overlap the signal interconnection line portion on the transmission side including the electrode land 52*b* and the electrode pattern 53*b* and a ground interconnection portion on the transmission side including the electrode lands 52*e* and 52*h* and the electrode patterns 53*e* and 53*h* in the substantially vertical direction. Accordingly, the isolation characteristic can be significantly improved.

Note that, since the coupling affect with the coil-shaped line pattern 62 that is closest to the internal electrode pattern is the greatest, at least the coil-shaped line pattern 62 is preferably disposed so as to be shifted towards the first and second reception terminals. In addition, in order to further improve the isolation characteristic, it is preferable that the coil-shaped line pattern 63 located on the lower side is disposed on the reception terminal side.

Furthermore, it is preferable that a plurality of connections are provided between the shield electrode and the ground terminal. In this manner, the potential of the shield electrode can be decreased, and therefore, the shield effect can be increased. Thus, the capacitive coupling can be reduced. As a result, the isolation characteristic can be further improved.

While the foregoing preferred embodiment has been described with reference to a transmission filter chip and a reception filter chip defined by a surface acoustic wave filter chip, a transmission filter chip and a reception filter chip may preferably be defined by a boundary elastic wave filter chip.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave duplexer comprising:
a transmission filter unit including an elastic wave filter;
a reception filter unit including an elastic wave filter;
a common connection end commonly connecting one end of the transmission filter unit to one end of the reception filter unit;
an impedance matching circuit unit disposed between the common connection end and a ground potential;
a laminated board;
a transmission filter chip flip-chip bonded onto the laminated board using a face-down method, the transmission filter chip including the transmission filter unit; and
a reception filter chip flip-chip bonded onto the laminated board using a face-down method, the reception filter chip including the reception filter unit; wherein
the transmission filter chip is a ladder filter including a first piezoelectric substrate, and the transmission filter chip includes an input terminal and an output terminal;
the reception filter chip is a longitudinally coupled resonator type filter including a second piezoelectric substrate, and the reception filter chip includes first and second reception terminals and a reception input terminal;
the laminated board includes a plurality of insulating layers, an interconnection pattern, and a matching circuit pattern defining an impedance matching circuit unit;
the interconnection pattern is provided on the laminated board and includes first and second electrode lands to which the output terminal of the transmission filter chip and the input terminal of the reception filter chip are connected, respectively, and an antenna electrode land;

the laminated board includes a first edge, a second edge located opposite the first edge, the transmission filter chip being disposed on one side of a center line extending in a direction between the first and second edges of the laminated board and passing through an approximate center of the laminated board, and the reception filter being disposed on the other side of the center line;

the matching circuit pattern includes a plurality of conductor patterns, via hole conductors to electrically connect the plurality of conductor patterns, and a coil-shaped line provided on the plurality of insulating layers, one end of the matching circuit pattern being connected to the antenna electrode land, and the other end of the matching circuit pattern being connected to a ground potential; and in plan view an approximate center of the coil-shaped line is located on a side of the center line of the elastic wave duplexer on which the reception filter chip is disposed.

2. The elastic wave duplexer according to claim 1, wherein, in plan view, the center of the coil-shaped line is located at a location corresponding to a vertex of an isosceles triangle having a base extending along a line that is substantially the same as a line between the first reception terminal and the second reception terminal of the reception filter chip.

3. The elastic wave duplexer according to claim 1, further comprising a shield electrode disposed between the matching circuit pattern and the interconnection pattern, the shield electrode being connected to the ground potential.

4. The elastic wave duplexer according to claim 3, wherein an external terminal is provided on a surface of the laminated board opposite a surface thereof on which the transmission filter chip and the reception filter chip are mounted, and the shield electrode is electrically connected to the external terminal by the plurality of via hole electrodes extending through the laminated board.

5. The elastic wave duplexer according to claim 1, wherein the interconnection pattern further includes a transmission signal interconnection pattern and a transmission ground interconnection pattern, and, in plan view, the coil-shaped line does not overlap the transmission signal interconnection pattern and the transmission ground interconnection pattern.

6. The elastic wave duplexer according claim 1, wherein the ladder filter includes a parallel-arm resonator and a series-arm resonator, the transmission filter chip further includes a bump connected to one end of the parallel-arm resonator, an electrode land connected to the bump is provided on the laminated board, and a series inductor is disposed between the electrode land and a ground potential.

7. The elastic wave duplexer according to claim 1, wherein
the longitudinally coupled resonator type filter included in the reception filter chip includes a first longitudinally coupled resonator type filter unit electrically connected to the first reception terminal and a second longitudinally coupled resonator type filter unit electrically connected to the second reception terminal;

the phase of an output signal with respect to an input signal of the second longitudinally coupled resonator type filter unit is different from the phase of an output signal with respect to an input signal of the first longitudinally coupled resonator type filter unit by about 180 degrees, and an electrical signal flows in the transmission filter chip in a direction from the second edge to the first edge of the laminated board;

in plan view, a direction of an electrical signal flowing in the first longitudinally coupled resonator type filter unit is substantially the same as the direction from the second edge to the first edge; and in plan view, a direction of an electrical signal flowing in the second longitudinally coupled resonator type filter unit is substantially the same as a direction from the first edge to the second edge.

* * * * *